(12) United States Patent
Kobamoto et al.

(10) Patent No.: US 9,006,559 B2
(45) Date of Patent: Apr. 14, 2015

(54) SOLAR CELL MODULE

(75) Inventors: Naoya Kobamoto, Kyoto (JP); Yuta Shinike, Omihachiman (JP); Takafumi Miyake, Ise (JP); Masayasu Yoshioka, Yasu (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/344,251

(22) PCT Filed: Sep. 13, 2012

(86) PCT No.: PCT/JP2012/073494
§ 371 (c)(1),
(2), (4) Date: Mar. 11, 2014

(87) PCT Pub. No.: WO2013/039158
PCT Pub. Date: Mar. 21, 2013

(65) Prior Publication Data
US 2014/0338719 A1 Nov. 20, 2014

(30) Foreign Application Priority Data
Sep. 13, 2011 (JP) ................................ 2011-199209

(51) Int. Cl.
*H01L 31/0224* (2006.01)
*H01L 31/05* (2014.01)

(52) U.S. Cl.
CPC ............ *H01L 31/0508* (2013.01); *Y02E 10/50* (2013.01); *H01L 31/022433* (2013.01)

(58) Field of Classification Search
CPC ..................... H01L 31/0508; H01L 31/022433
USPC ......................................... 136/244, 256, 255
See application file for complete search history.

(56) References Cited

U.S. PATENT DOCUMENTS 3,903,428 A * 9/1975 DeJong ........................ 136/244
6,384,317 B1 * 5/2002 Kerschaver et al. .......... 136/256
(Continued)

FOREIGN PATENT DOCUMENTS

JP 2000-261012 A 9/2000
JP 2002-164550 A 6/2002
(Continued)

OTHER PUBLICATIONS

International Preliminary Report on Patentability dated Mar. 18, 2014 issued for International application No. PCT/JP2012/073494.
(Continued)

*Primary Examiner* — Golam Mowla
(74) *Attorney, Agent, or Firm* — Procopio, Cory, Hargreaves & Savitch LLP

(57) ABSTRACT

A solar cell module comprises a plurality of solar cell elements including a front surface electrode and a wiring member electrically interconnecting the solar cell elements. The front surface electrode includes a bus bar electrode and finger electrodes, the finger electrodes including a plurality of first finger electrodes and connected to the bus bar electrode, and a plurality of second finger electrodes not connected to the bus bar electrode. The front surface electrode further includes a fine wire electrode that is disposed in a region extending from the bus bar electrode in a longitudinal direction of the bus bar electrode and that is electrically connected to the second finger electrodes, the fine wire electrode including first and second fine wire electrodes intersecting to each other. The wiring member is connected to an intersection of the first and second fine wire electrodes and to the bus bar electrode.

13 Claims, 11 Drawing Sheets

(56) References Cited

U.S. PATENT DOCUMENTS

| | | |
|---|---|---|
| 7,144,751 B2 * | 12/2006 | Gee et al. .................. 438/98 |
| 7,902,454 B2 * | 3/2011 | Kinoshita ................. 136/256 |
| 8,049,099 B2 * | 11/2011 | Hishida et al. ............ 136/256 |
| 8,440,907 B2 | 5/2013 | Kurahashi et al. |
| 2008/0276981 A1 * | 11/2008 | Kinoshita et al. .......... 136/244 |
| 2009/0139570 A1 * | 6/2009 | Kinoshita ................. 136/256 |
| 2009/0272419 A1 * | 11/2009 | Sakamoto et al. .......... 136/244 |
| 2009/0277491 A1 * | 11/2009 | Nakamura et al. .......... 136/244 |
| 2010/0275964 A1 * | 11/2010 | Kinoshita ................. 136/244 |
| 2011/0011454 A1 | 1/2011 | Taira |
| 2012/0048369 A1 * | 3/2012 | Kobamoto ................. 136/256 |
| 2012/0167982 A1 * | 7/2012 | Fujishima et al. .......... 136/256 |
| 2012/0211049 A1 * | 8/2012 | Kobamoto et al. .......... 136/244 |

FOREIGN PATENT DOCUMENTS

| | | |
|---|---|---|
| JP | 2005-252108 A | 9/2005 |
| JP | 2007-287861 A | 11/2007 |
| JP | 2010-027778 A | 2/2010 |
| WO | 2009/099179 A1 | 8/2009 |

OTHER PUBLICATIONS

International Search Report dated Oct. 9, 2012, issued for International Application No. PCT/JP2012/073494.

* cited by examiner ial view when looking from the side facing the first surface, and FIG. 4B is an enlarged plan view of a portion C in FIG. 4A.
SOLAR CELL MODULE

TECHNICAL FIELD

The present invention relates to a solar cell module.

BACKGROUND ART

A solar cell element in a solar cell module includes a surface electrode on the first surface side of the solar cell element. The surface electrode includes a finger electrode for collecting carriers generated in a silicon substrate, for example, which constitutes a part of the solar cell element. The surface electrode further includes a bus bar electrode collecting the carriers and connected to a wiring member that electrically interconnects the solar cell elements arrayed in adjacent relation. Japanese Unexamined Patent Application Publication No. 2010-027778 discloses a solar cell element employing a band-shaped bus bar electrode.

Aiming at further cost reduction of the solar cell elements, it has recently been proposed to form many openings inside the bus bar electrode. However, a solar cell module including that type of solar cell element has a difficulty in maintaining high reliability for a long term in some cases.

One object of the present invention is to provide a solar cell module having high long-term reliability.

SUMMARY OF INVENTION

A solar cell module according to one embodiment of the present invention includes a plurality of solar cell elements each including a front surface and a front surface electrode on a side of the front surface, and a wiring member that electrically interconnects the solar cell elements and that extends in a first direction. In the embodiment, the front surface electrode includes a bus bar electrode extending in the first direction, and finger electrodes arrayed at intervals in the first direction, the finger electrodes including a plurality of first finger electrodes having a linear shape and connected to the bus bar electrode, and a plurality of second finger electrodes not connected to the bus bar electrode. The front surface electrode further includes a fine wire electrode that is disposed in a region extending from the bus bar electrode in a longitudinal direction of the bus bar electrode and that is electrically connected to the second finger electrode, the fine wire electrode including a first fine wire electrode and a second fine wire electrode intersecting the first fine wire electrode. In the embodiment, the fine wire electrode has a width W1 smaller than a first dimension D1 of the bus bar electrode in the first direction and than a second dimension D2 of the bus bar electrode in a second direction perpendicular to the first direction. Moreover, in the embodiment, the wiring member is connected to an intersection of the first fine wire electrode and the second fine wire electrode and to the bus bar electrode.

According to the solar cell module described above, long-term reliability can be increased.

BRIEF DESCRIPTION OF DRAWINGS

FIG. 1A is an entire schematic view when looking from the side facing a first surface of the solar cell element, and FIG. 1B is an enlarged plan view of a portion A in FIG. 1A.

FIG. 4A is a partial schematic view when looking from the side facing the first surface, and FIG. 4B is an enlarged plan view of a portion C in FIG. 4A.

FIG. 5A is a partial enlarged sectional view of the solar cell module, and FIG. 5B is a plan view of the solar cell module when looking from the side facing the first surface.

FIG. 6A is an entire view, FIG. 6B is an enlarged plan view of a portion D in FIG. 6A, and FIG. 6C is an enlarged plan view of the portion D in FIG. 6A to explain a state where a wiring member is connected.

FIG. 7A is an entire view, FIG. 7B is an enlarged plan view of a portion E in FIG. 7A, and FIG. 7C is an enlarged plan view of the portion E in FIG. 7A to explain a state where a wiring member is connected.

FIG. 10A is an entire view, FIG. 10B is an enlarged plan view of a portion F in FIG. 10A, and FIG. 10C is an enlarged plan view of the portion F in FIG. 10A to explain a state where a wiring member is connected.

FIG. 11A is an entire view, FIG. 11B is an enlarged plan view of a portion G in FIG. 11A, and FIG. 11C is an enlarged plan view of the portion G in FIG. 11A to explain a state where a wiring member is connected.

EMBODIMENTS FOR CARRYING OUT OF THE INVENTION

Solar Cell Module

First Embodiment

Figure 1A:
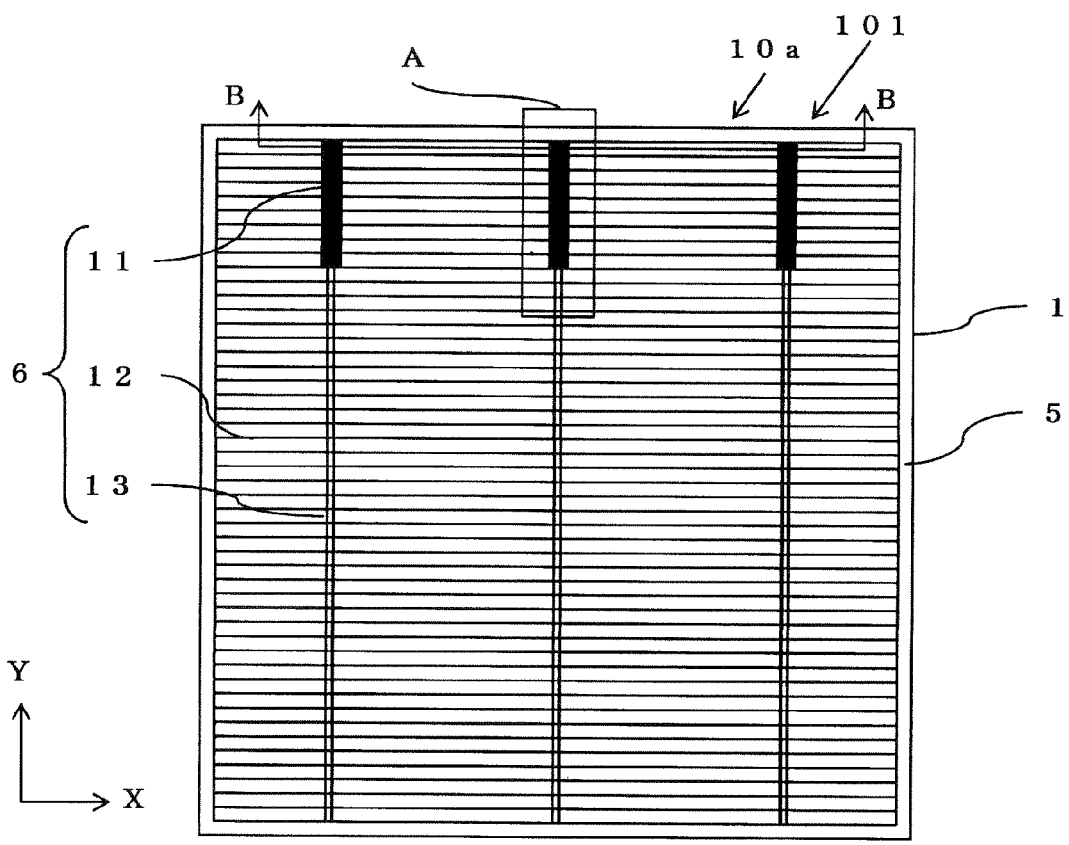
FIGS. 1A and 1B are a schematic plans view to explain a solar cell element in a solar cell module according to a first embodiment of the present invention; specifically.

A solar cell module 201 according to a first embodiment of the present invention includes a plurality of solar cell elements 101 that are arrayed adjacent to each other, and wiring members 25 that electrically interconnect the adjacent solar cell elements 101. Each of the solar cell elements 101 has a light receiving surface (i.e., an upper surface in FIG. 5A, the surface being called a first surface hereinafter) 10a upon which light is incident, and a light not-receiving surface (i.e., a lower surface in FIG. 5A, the surface being called a second surface hereinafter) 10b that corresponds to a rear surface in opposite relation to the first surface 10a. In other words, the first surface 10a corresponds to a front surface of the solar cell module 201, and the second surface 10b corresponds to a rear surface of the solar cell module 201.

Figure 5A:
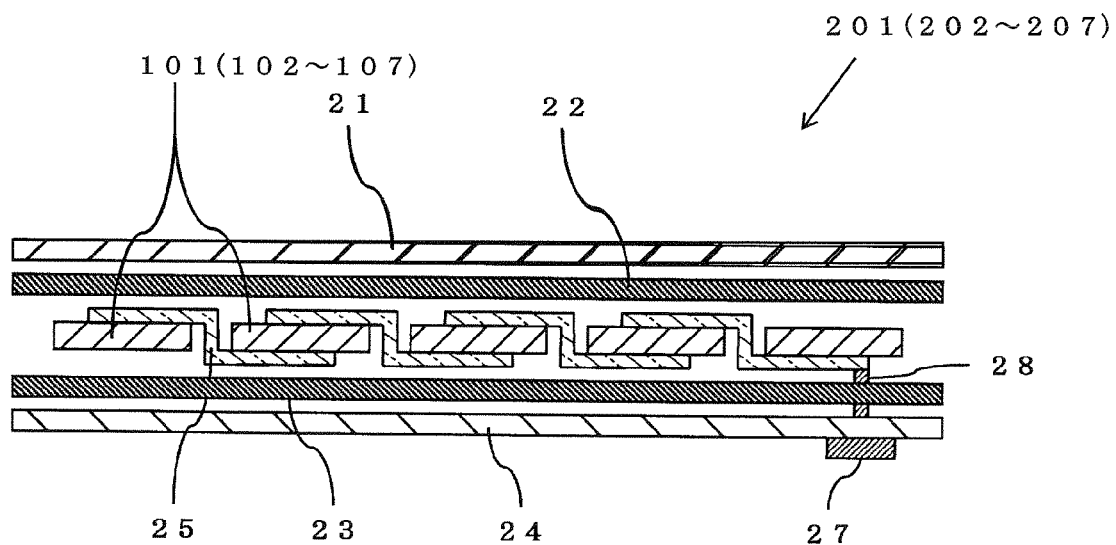
FIGS. 5A and 5B are schematic views to explain the solar cell module according to the first embodiment of the present invention; specifically.

As illustrated in FIG. 5A, the solar cell module 201 further includes a light transmissive member 21, a front-side filling member 22, a rear-side filling member 23, and a rear surface protective member 24. Those members, including the solar cell elements 101, are arranged in a layered structure in the order of the light transmissive member 21, the front-side filling member 22, the solar cell elements 101, the rear-side filling member 23, and the rear surface protective member 24 from the upper side, as illustrated in FIG. 5A.

Light Transmissive Member

The light transmissive member 21 is disposed on the same side as the first surface 10a of the solar cell element 101, and it has the function of protecting the first surface 10a. The light transmissive member 21 is made of glass, for example.

Front-Side Filling Member and Rear-Side Filling Member

The front-side filling member 22 and the rear-side filling member 23 have the function of sealing off the solar cell element 101. The front-side filling member 22 is made of a transparent olefin resin, for example. The olefin resin may be an ethylene vinyl acetate copolymer (EVA), for example. The rear-side filling member 23 may be made of a transparent or white olefin resin, for example.

Rear Surface Protective Member

The rear surface protective member 24 has the function of protecting the solar cell element 101 on the side including the second surface 10b. The rear surface protective member 24 has a single-layer or multilayer structure made of one or more of polyethylene terephthalate (PET) and a polyvinyl fluoride resin (PVF), for example.

Wiring Member

The wiring member 25 has the function of electrically interconnecting the solar cell elements 101 arrayed in adjacent relation, and it has a long shape, for example. With respect to the adjacent solar cell elements 101, the wiring member 25 connects a first electrode 6 disposed on the first surface 10a side of one solar cell element 101 and a second electrode 7 disposed on the second surface 10b side of the other solar cell element 101. Thus, the adjacent solar cell elements 101 are electrically connected in series. The wiring member 25 may be, e.g., a member made of a copper foil having a thickness of about 0.1 to 0.2 mm and a width of about 2 mm, the copper foil being entirely coated with a solder material.

Solar Cell Element

As illustrated in FIGS. 1A to 4B, the solar cell element 101 has, as described above, the light receiving surface (first surface) 10a upon which light is incident, and the light not-receiving surface (second surface) 10b that corresponds to the rear surface in opposite relation to the first surface 10a.

In this embodiment, as illustrated in FIGS. 1A to 3, the solar cell element 101 includes a semiconductor substrate 1 (including a first semiconductor layer 2, a second semiconductor layer 3, and a third semiconductor layer 4), an anti-reflection layer 5, the first electrode 6, and the second electrode 7.

The semiconductor substrate 1 is, e.g., a plate-shaped silicon substrate. More specifically, as illustrated in FIG. 3, the semiconductor substrate 1 includes, for example, the first semiconductor layer (p-type semiconductor layer) 2 that is a semiconductor layer having one conductivity type, and the second semiconductor layer (n-type semiconductor layer) 3 that is a semiconductor layer having the opposite conductivity type and disposed on the first semiconductor layer 2 at the same side as the first surface 10a.

The first semiconductor layer 2 may be formed of a plate-shaped semiconductor having, e.g., the p-type. For example, a single-crystalline silicon substrate or a polycrystalline silicon substrate is used as the semiconductor forming the first semiconductor layer 2. A thickness of the first semiconductor layer 2 may be set to, e.g., 250 μm or less and preferably 150 μm or less. Although the shape of the first semiconductor layer 2 is not limited to particular one, the first semiconductor layer 2 may have a polygonal shape, e.g., a rectangular shape, in a plan view, taking into consideration the manufacturing method. When the first semiconductor layer 2 made of the silicon substrate has the p-type, boron or gallium, for example, can be used as a dopant element.

The second semiconductor layer 3 is a semiconductor layer that forms a pn-junction with the first semiconductor layer 2. Thus, the second semiconductor layer 3 has a conductivity type opposite to that of the first semiconductor layer 2, i.e., an n-type. When the first semiconductor layer 2 is made of the silicon substrate having the p-type conductivity, the second semiconductor layer 3 can be formed, for example, by diffusing an impurity, e.g., phosphorus, into a portion of the silicon substrate, which is positioned close to the first surface 10a.

Figure 3:
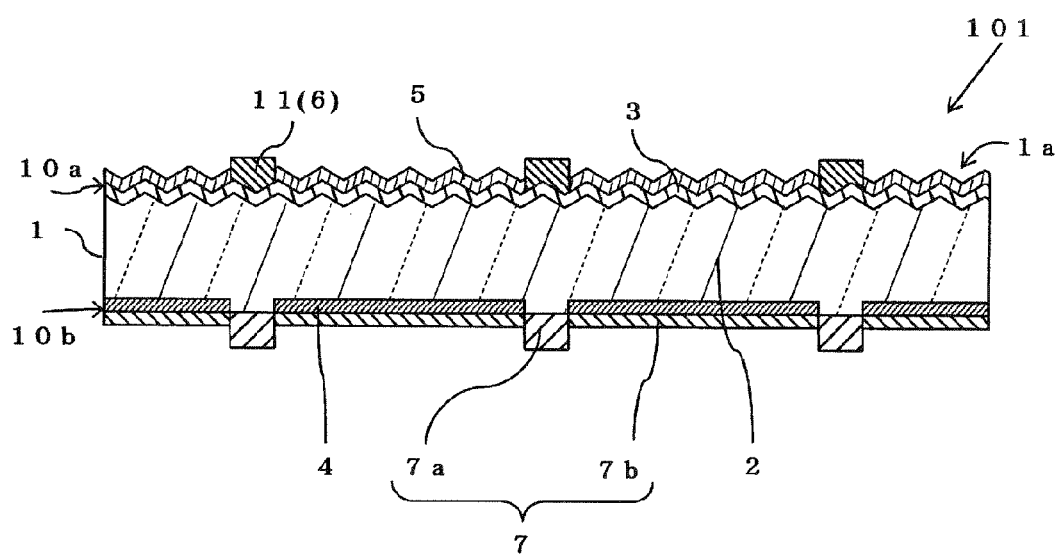
FIG. 3 is a schematic sectional view taken along a line B-B in FIG. 1A.

As illustrated in FIG. 3, a concavo-convex shape 1a is formed in a surface of the semiconductor substrate 1 at the first surface 10a side. Each projection of the concavo-convex shape 1a has a height of about 0.1 to 10 μm and a width of about 0.1 to 20 μm. The concavo-convex shape 1a is not limited to a pyramidal shape illustrated in FIG. 3, and it may be formed such that each recess has a substantially spherical shape.

Herein, the height of the projection implies, assuming a line passing bottoms of the recesses to be a reference line, a distance from the reference line to a top of the projection in a direction perpendicular to the reference line. The width of the projection implies a distance between the tops of two adjacent projections in a direction parallel to the reference line.

The anti-reflection layer 5 is a film for increasing absorption of light and is formed at the first surface 10a side of the semiconductor substrate 1. More specifically, the anti-reflection layer 5 is disposed on the second semiconductor layer 3 at the same side as the first surface 10a. The anti-reflection layer 5 is formed of, e.g., a silicon nitride film, a titanium oxide film, a silicon oxide film, a magnesium oxide film, an indium tin oxide film, a tin oxide film, or a zinc oxide film. A thickness of the anti-reflection layer 5 can optionally be selected depending on materials. Thus, it is sufficient that the thickness of the anti-reflection layer 5 is set to a value at which a non-reflecting condition is satisfied for adequate incident light. The anti-reflection layer 5 may have a refractive index of about 1.8 to 2.3 and a thickness of about 500 to 1200 Å, for example. When the anti-reflection layer 5 is made of a silicon nitride film, a passivation effect can also be obtained.

The third semiconductor layer 4 is formed at the second surface 10b side of the semiconductor substrate 1, and it has the same conductivity type as that of the first semiconductor layer 2. In this embodiment, therefore, the third semiconductor layer 4 has the p-type conductivity. Furthermore, a dopant concentration in the third semiconductor layer 4 is higher than that in the first semiconductor layer 2. Stated in another way, a dopant element is present in the third semiconductor layer 4 at a higher concentration than in the first semiconductor layer 2 in which the dopant element is doped to provide the one conductivity type. The third semiconductor layer 4 having such a higher dopant concentration serves to reduce reduction of conversion efficiency caused by recombination of the carriers in the semiconductor substrate 1 near the second surface 10b. Thus, the third semiconductor layer 4 forms an internal electric field in a portion of the semiconductor substrate 1 at the side close to the second surface 10b. The third semiconductor layer 4 can be formed, for example, by diffusing a dopant element, e.g., boron or aluminum, into a portion of the semiconductor substrate 1, which is positioned close to the second surface 10b. At that time, the concentration of the dopant element contained in the third semiconductor layer 4 may be set to about $1\times10^{18}$ to $5\times10^{21}$ atoms/cm$^3$, for example.

Figure 2:
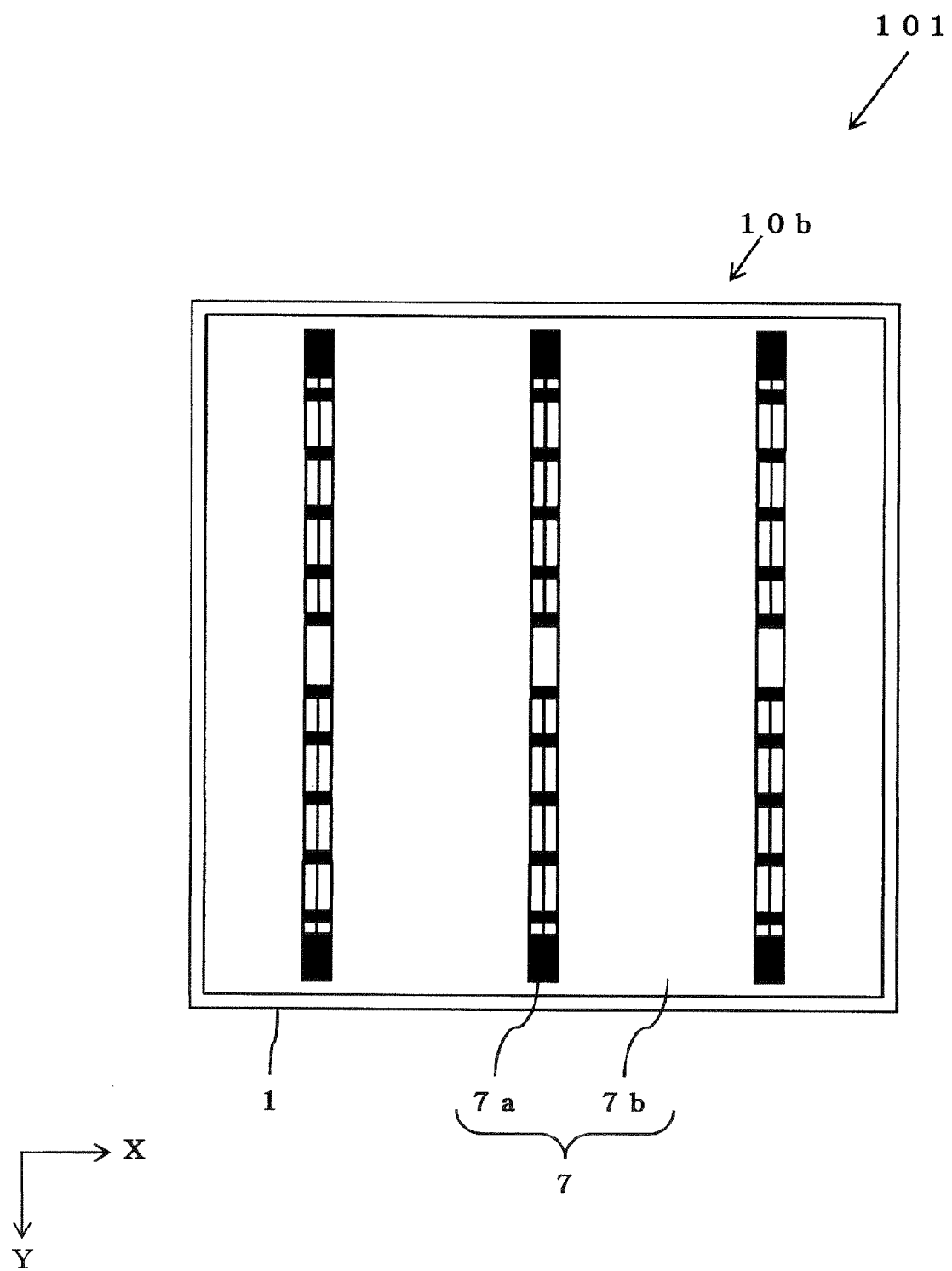
FIG. 2 is a schematic plan view of the solar cell element illustrated in FIG. 1A, when looking from a direction facing a second surface of the solar cell element.

The second electrode 7 is an electrode (rear electrode) disposed at the second surface 10b side of the semiconductor substrate 1. As illustrated in FIG. 2, the second electrode 7 includes a second output taking-out electrode 7a and a second power collecting electrode 7b.

The second output taking-out electrode 7a is a portion of the second electrode 7, the portion being connected to the wiring member 25. For example, the second output taking-out electrode 7a has a thickness of about 10 to 30 μm and a width of about 1.3 to 7 mm in the short direction thereof (i.e., in the X-direction in FIG. 2). The second output taking-out electrode 7a may be formed, for example, by coating a conductive paste, which contains silver as a main component, in a desired shape, and then firing the coated paste.

The second power collecting electrode 7b is electrically connected to the second output taking-out electrode 7a, and it serves to collect electric power generated in the semiconductor substrate 1 and to send the electric power to the second output taking-out electrode 7a. The second power collecting electrode 7b has a thickness of about 15 to 50 μm, for example. The second power collecting electrode 7b is formed, for example, over substantially the entire second surface 10b of the semiconductor substrate 1 except for a region where the second output taking-out electrode 7a is formed. The second current collecting electrode 7b can be formed, for example, by coating an aluminum paste in a desired shape, and then firing the coated paste.

The first electrode 6 is an electrode (front surface electrode) disposed at the first surface 10a side of the semiconductor substrate 1. As illustrated in FIG. 1A, the first electrode 6 includes a bus bar electrode 11 and a fine wire electrode 13, both corresponding to a first output taking-out electrode, and a plurality of finger electrodes 12 having linear shapes and corresponding to a first power collecting electrode.

The bus bar electrode 11 is, for example, a slender electrode extending in a wiring direction that corresponds to a first direction (Y-direction). Thus, the bus bar electrode 11 has a band-like shape of which longitudinal direction is the first direction, for example.

Figure 1B:
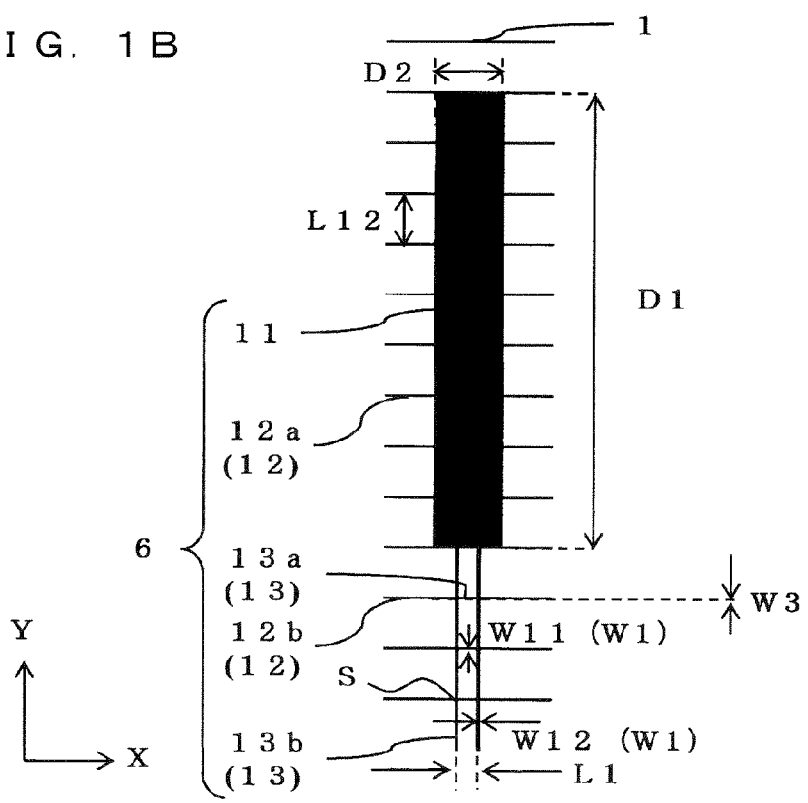

The finger electrodes 12 are arrayed at predetermined intervals in the wiring direction (Y-direction in FIGS. 1A and 1B), and a longitudinal direction of each finger electrode 12 extends in a direction (X-direction in FIGS. 1A and 1B) perpendicular to the wiring direction. In this Description, the wiring direction implies a direction in which the solar cell elements 101 are arrayed in a line. As illustrated in FIG. 1B, the finger electrodes 12 include electrodes (first finger electrodes 12a) that are connected to the bus bar electrode 11, and electrodes (second finger electrodes 12b) that are not connected to the bus bar electrode 11.

The first finger electrodes 12a are connected to lateral surfaces of the bus bar electrode 11 extending parallel to the wiring direction. At least one of the second finger electrodes 12b is electrically connected to the fine wire electrode 13. In this embodiment, as illustrated in FIG. 1B, the second finger electrodes 12b are all electrically connected to the fine wire electrode 13.

A width W1 of the fine wire electrode 13 in the short direction thereof is smaller than a first dimension D1 of the bus bar electrode 11 in the longitudinal direction thereof (i.e., in the first direction), and than a second dimension D2 of the bus bar electrode 11 in a direction (i.e., the second direction) perpendicular to the longitudinal direction thereof. Furthermore, as illustrated in FIG. 1B, the fine wire electrode 13 includes a first fine wire electrode 13a extending in the longitudinal direction (i.e., the X-direction in FIGS. 1B) of the finger electrode 12. Moreover, as illustrated in FIG. 1B, the fine wire electrode 13 includes a second fine wire electrode 13b extending in the wiring direction (i.e., the Y-direction in FIG. 1B). With such an arrangement, the second fine wire electrode 13b intersects the first fine wire electrode 13a. Thus, an intersection S at which the first fine wire electrode 13a and the second fine wire electrode 13b intersect is formed in the fine wire electrode 13. It is to be noted that the first fine wire electrode 13a and the second fine wire electrode 13b are not always required to intersect perpendicularly insofar as the intersection S is formed in the fine wire electrode 13.

In this embodiment, as illustrated in FIGS. 1A, 1B, 4A and 4B, the intersection S between the first fine wire electrode 13a and the second fine wire electrode 13b and the bus bar electrode 11 are connected to the wiring member 25. Accordingly, even when stress acts on the first fine wire electrode 13a due to a daily temperature cycle caused in the longitudinal direction of the wiring member 25, for example, the stress is dispersed to the second fine wire electrode 13b through the intersection S. Because the width W1 of the fine wire electrode 13 in the short direction is smaller than the first dimension D1 and the second dimension D2 of the bus bar electrode 11 as described above, the fine wire electrode 13 is more susceptible to the influence of the above-mentioned stress. This leads to a possibility that adhesion force in a connected portion between the wiring member 25 and the first fine wire electrode 13a may become weaker than that in a connected portion between the wiring member 25 and the bus bar electrode 11. In contrast, in this embodiment, since the wiring member 25 is connected to the intersection S, the above-mentioned stress is dispersed, and the adhesion force between the wiring member 25 and the fine wire electrode 13 is maintained. As a result, long-term reliability of the solar cell module 201 increases. In addition, since this embodiment employs, as described above, the fine wire electrode 13 having the linear shape and having the width W1 smaller than the first dimension D1 and the second dimension D2 of the bus bar electrode 11, the electric power collected by the second finger electrodes 12b can be more easily taken out from the wiring member 25 while an amount of electrode material used is reduced. Hence the solar cell module 201 can be manufactured at a lower cost.

The second fine wire electrode 13b may be connected in a state coupling at least a pair of adjacent first fine wire electrodes 13a (finger electrodes 12) to each other. With such an arrangement, even when the wiring member 25 is disconnected from a part of the first fine wire electrodes 13a, the second fine wire electrode 13b is kept connected to the wiring member 25, and the collected electric power can be supplied to the first fine wire electrode 13a, which is adjacent to the disconnected first fine wire electrode 13a, through the second fine wire electrode 13b. As a result, power loss can be reduced.

In this embodiment, as illustrated in FIG. 1B, a width W12 of the second fine wire electrode 13b in the short direction thereof (i.e., in the X-direction in FIG. 1B) is greater than a width W11 of the first fine wire electrode 13a in the short direction thereof (i.e., in the Y-direction in FIG. 1B). Accordingly, even when the wiring member 25 is disconnected from a plurality of adjacent first fine wire electrode 13a and an amount of current flowing through the second fine wire electrode 13b increases, the power loss can be reduced. The width W12 of the second fine wire electrode 13b in the short direction thereof is, for example, about 1.5 to 3 times the width W11 of the first fine wire electrode 13a in the short direction thereof.

The second fine wire electrode 13b may be disposed in any desired number although it is sufficient that one or second fine wire electrodes 13b are disposed. In this embodiment, as illustrated in FIG. 1B, the second fine wire electrode 13b is a pair of electrodes extending in the wiring direction (Y-direction in FIG. 1B). Furthermore, the second fine wire electrodes 13b are connected to the bus bar electrode 11 and are arrayed at an interval of a first distance L1 that is smaller than the second dimension D2 of the bus bar electrode 11. With such an arrangement, the second finger electrodes 12b, which are not connected to the lateral surfaces of the bus bar electrode 11, and the bus bar electrode 11 can be electrically connected to each other through the second fine wire electrodes 13b. As a result, the power loss can be further reduced.

In this embodiment, the first fine wire electrode 13a may be a portion of the finger electrode 12. In such a modified form, the wiring member 25 is connected to the finger electrode 12. Therefore, the second finger electrodes 12b not connected to the bus bar electrode 11 are directly connected to the wiring member 25. Thus, the electric power collected by the second finger electrodes 12b can be satisfactorily taken out to the wiring member 25.

Dimensions of the bus bar electrode 11 may be set, for example, as follows. The second dimension D2 in the short direction (X-direction in FIG. 1B) is about 1.3 to 2.5 mm, and the first dimension D1 in the longitudinal direction (Y-direction in FIG. 1B) is about 1.5 to 10 mm.

Furthermore, respective widths W3 and W1 of the finger electrode 12 and the fine wire electrode 13 in the short direction thereof (i.e., in the Y-direction in FIG. 1B) are each smaller than the width (first dimension D1) of the bus bar electrode 11 in the longitudinal direction thereof. That setting contributes to reducing the amount of electrode material used. Moreover, the width W1 (W11) of the fine wire electrode 13 in the short direction thereof may be equal to or greater than the width W3 of the finger electrode 12 in the short direction thereof. That setting contributes to further reducing the amount of electrode material used. The respective widths W3 and W1 of the finger electrode 12 and the fine wire electrode 13 in the short direction thereof are each about 50 to 200 μm.

In this embodiment, the plural finger electrodes 12 are disposed at an interval L12 of about 1.5 to 3 mm. The interval L12 can optionally be selected depending on the sheet resistance of the second semiconductor layer 3 and so on.

A thickness of the first electrode 6 is about 10 to 40 μm, for example. The first electrode 6 can be formed, for example, by coating a conductive paste, which contains silver as a main component, in a desired shape by, e.g., screen printing, and then firing the coated paste. An electrode connecting the adjacent finger electrodes 12 to each other in an end portion of the solar cell element 101 may be disposed additionally.

Figure 4A:
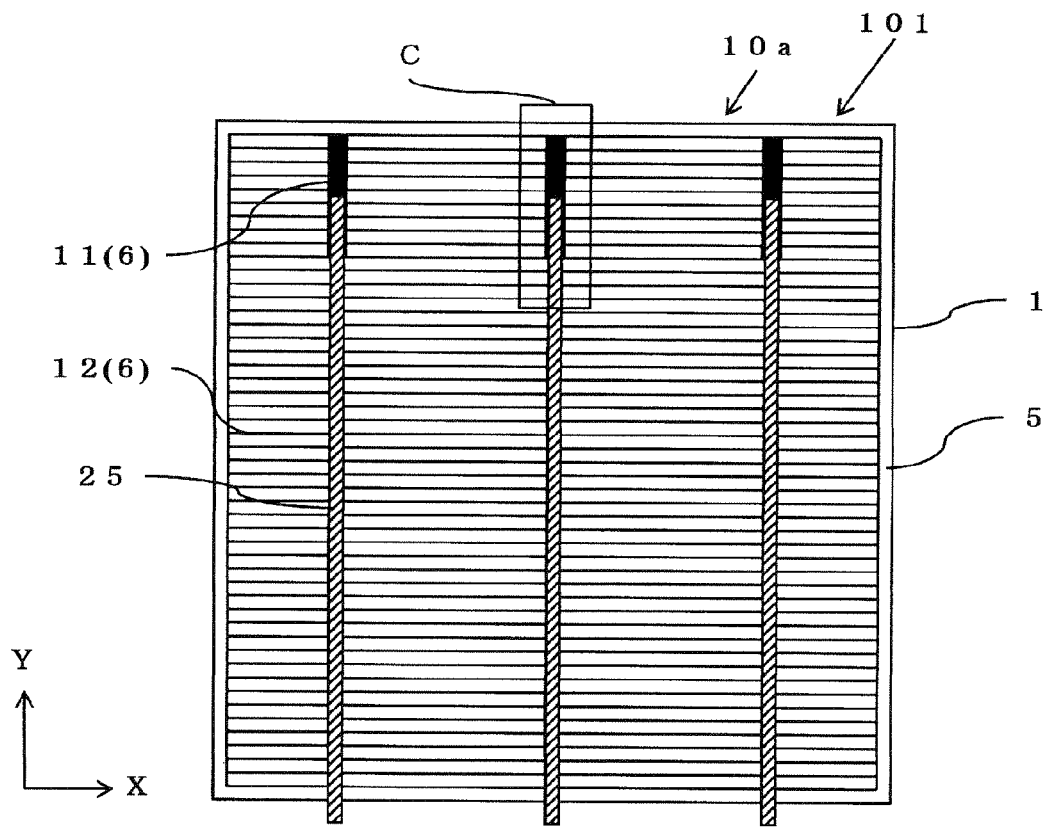
FIGS. 4A and 4B are schematic plan views to explain the solar cell module according to the first embodiment of the present invention; specifically.
Figure 4B:
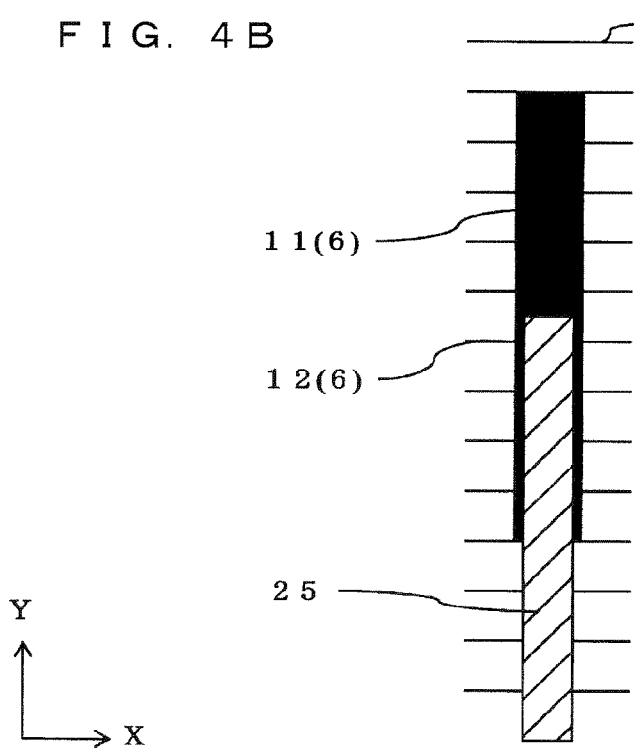

An end portion of the wiring member 25 may be connected to the bus bar electrode 11, as illustrated in FIGS. 4A and 4B, in a plan view looking from the side facing the first surface 10a. Thus, by arranging the bus bar electrode 11 having the relatively large first dimension D1 in a portion of the first electrode 6, which portion is connected to the end portion of the wiring member 25 that tends to undergo large stress due to the daily temperature cycle, the wiring member 25 is less apt to disconnect from the first electrode 6 even when the solar cell element 101 is used for a long term. As a result, the long-term reliability of the solar cell module 201 is further increased.

Method of Manufacturing Solar Cell Module

A method of manufacturing the solar cell module 201 according to this embodiment will be described in detail below with reference to FIGS. 5A and 5B. In the solar cell module 201, the plural solar cell elements 101 are interconnected by the wiring member 25.

At the start of the manufacturing, the above-described individual components of the solar cell module 201 are prepared. The solar cell element 101 according to this embodiment can be manufactured as follows.

Details of the method of manufacturing the solar cell element 101 are described in order of successive steps.

A substrate preparation step of preparing the semiconductor substrate (polycrystalline silicon substrate) 1 including the first semiconductor layer (p-type semiconductor layer) 2 is described at the beginning. The semiconductor substrate 1 is formed, for example, by the existing casting method and the like. It is to be noted that the following description is made in connection with an example in which a polycrystalline silicon substrate having the p-type is used as the semiconductor substrate 1.

First, an ingot of polycrystalline silicon is fabricated by the casting method, for example. The ingot is then sliced into a sheet having a thickness of, e.g., 250 μm or less. Thereafter, surfaces of the semiconductor substrate 1 may be etched just a little by using NaOH, KOH, hydrofluoric acid, nitrohydrofluoric acid or the like to clean a mechanically damaged layer and a contaminated layer at a cut surface of the semiconductor substrate 1.

Next, the concavo-convex shape 1a is formed at the first surface 10a of the semiconductor substrate 1. The concavo-convex shape 1a can be formed by the wet etching method using an alkaline solution, such as NaOH, or an acid solution, such as nitrohydrofluoric acid, or by the dry etching method with RIE (reactive ion etching), for example. When a concavo-convex shape is formed in the second surface 10b, the concavo-convex shape can be formed in a similar manner to the step of forming the concavo-convex shape 1a.

Next, a step of forming the second semiconductor layer 3 at the first surface 10a side of the semiconductor substrate 1 including the concavo-convex shape 1a, which has been formed in the above-described step, is executed. More specifically, the second semiconductor layer 3 of the n-type is formed in a front surface layer of the semiconductor substrate 1 at the first surface 10a side including the concavo-convex shape 1a.

The second semiconductor layer 3 is formed, for example, by the coating thermal diffusion method in which paste-like $P_2O_5$ is applied onto the surface of the semiconductor substrate 1 and then is thermally diffused, or by a vapor phase thermal diffusion method in which gaseous $POCl_3$ (phosphorous oxychloride) is diffusion source. The second semiconductor layer 3 is formed in a depth of about 0.2 to 2 μm with a sheet resistance value of about 40 to 200 Ω/□ (unit square).

It is to be noted that the method of forming the second semiconductor layer 3 is not limited to the above-described one. An n-type hydrogenated amorphous silicon film, a crystalline silicon film including a microcrystalline silicon film or the like may be formed, for example, as the second semiconductor layer 3, by using the thin film technique. In addition, an i-type silicon region may be formed between the first semiconductor layer 2 and the second semiconductor layer 3.

Through the above-described steps, the polycrystalline silicon substrate (semiconductor substrate) 1 including the p-type semiconductor layer (first semiconductor layer) 2, can be prepared in which the second semiconductor layer 3 is arranged as the n-type semiconductor layer at the first surface 10a side and the concavo-convex shape 1a is formed on its surface.

Next, the anti-reflection layer 5 is formed on the second semiconductor layer 3, i.e., at the first surface 10a side of the semiconductor substrate 1. The anti-reflection layer 5 is formed by, e.g., the PECVD (plasma enhanced chemical vapor deposition) method, the vapor deposition method, the sputtering method or the like. For instance, when the anti-reflection layer 5 made of a silicon nitride film is formed by the PECVD method, a gaseous mixture of silane ($SiH_4$) and ammonia ($NH_3$) diluted with nitrogen ($N_2$) is plasmatized and deposited by glow discharge decomposition to thereby form the anti-reflection layer 5. A temperature in a film forming chamber in the above-mentioned process may be set to about 500° C.

Next, the third semiconductor layer 4 in which semiconductor impurities having the one conductivity type is diffused at a higher concentration is formed at the second surface 10b side of the semiconductor substrate 1. The third semiconductor layer 4 can be formed, for example, by any of the following two methods. According to a first method, the third semiconductor layer 4 is formed through thermal diffusion using, as a diffusion source, boron tribromide ($BBr_3$), at about 800 to 1100° C. According to a second method, the third semiconductor layer 4 is formed by applying an aluminum paste, which is made of aluminum powder, an organic vehicle, and so on, with printing, and then heat-treating (firing) the applied aluminum paste at about 600 to 850° C. such that aluminum is diffused into the semiconductor substrate 1. Using the second method is advantageous in that a desired diffusion region can be formed only in a printed surface, and that the n-type layer, i.e., the layer having the opposite conductivity type, which has been formed at the second surface 10b side of the semiconductor substrate 1 in the step of forming the second semiconductor layer 3, is not needed to be removed. In the case using the second method, therefore, it is just required, after forming the desired diffusion region, to perform pn-separation by using a laser or the like, for example, only on an outer peripheral portion of the first surface 10a or the second surface 10b. It is to be noted that the method of forming the third semiconductor layer 4 is not limited to the above-described one. A hydrogenated amorphous silicon film, a crystalline silicon film including a microcrystalline silicon film, or the like may be formed, for example, as a third semiconductor layer 4, by using the thin film technique. In addition, an i-type silicon region may be formed between the semiconductor layer substrate 1 and the third semiconductor layer 4.

Next, the first electrode 6 (including the bus bar electrode 11, the finger electrode 12, and the fine wire electrode 13) and the second electrode 7 (including the second output taking-out electrode 7a and the second power collecting electrode 7b) are formed as follows.

A manner of forming the first electrode 6 is first described. The first electrode 6 is formed, for example, by using a conductive paste, which contains metal powder made of silver (Ag) or the like, an organic vehicle, and glass frit. The conductive paste is applied over the first surface 10a side of the semiconductor substrate 1 and then fired at about 600 to 850° C. for about several tens seconds to several tens minutes, whereby the first electrode 6 is formed. The conductive paste can be applied by the screen printing method or the like. After the applying, the conductive paste may be dried through evaporation of a solvent at a predetermined temperature. Although the first electrode 6 includes the bus bar electrode 11, the finger electrode 12, and the fine wire electrode 13 as described above, the bus bar electrode 11, the finger electrode 12, and the fine wire electrode 13 can be formed in one step by using the screen printing method. The bus bar electrode 11, the finger electrode 12, and the fine wire electrode 13 may be formed in separate printing steps. After forming the bus bar electrode 11, the finger electrode 12, and the fine wire electrode 13 in one printing step, only the finger electrode 12 may be formed again by another screen printing step to increase the thickness of the finger electrode 12.

The second electrode 7 is then formed. First, the second power collecting electrode 7b is formed, for example, by using an aluminum paste, which contains aluminum powder and an organic vehicle. The aluminum paste is applied to almost the entire surface of the second surface 10b except for portions where the second output taking-out electrodes 7a are to be formed. The aluminum paste can be applied by the screen printing method, for example. After the above-mentioned applying, the conductive paste may be dried through evaporation of a solvent at a predetermined temperature. In such a case, the aluminum paste is less apt to adhere to other portions in subsequent operations, and workability is increased. As described above, the third semiconductor layer 4 and the second power collecting electrode 7b may be formed in the same step.

Next, the second output taking-out electrode 7a is formed, for example, by using a silver paste, which contains metal powder made of silver powder or the like, an organic vehicle and glass frit. The silver paste is applied on the second surface 10b in a predetermined shape. At that time, the silver paste forming the second output taking-out electrode 7a is applied at a position where the silver paste will contact with a part of the aluminum paste forming the second power collecting electrode 7b, whereby the second output taking-out electrode 7a and the second power collecting electrode 7b are formed in partly overlapped relation. The silver paste can be applied by the screen printing method, for example. After the applying, the silver paste may be dried through evaporation of a solvent at a predetermined temperature.

Thereafter, the semiconductor substrate 1 to which the aluminum paste and the silver paste have been applied as described above, is fired in a firing furnace under condition of 600 to 850° C. for about several tens seconds to several tens minutes. The second electrode 7 is thus formed at the second surface 10b side of the semiconductor substrate 1.

While the first electrode 6 and the second electrode 7 are formed in the above description by the printing and firing method, they may be formed by one of other methods, such as vapor deposition, sputtering, and plating.

The solar cell element 101 can be fabricated through the above-described process.

Next, the solar cell module 201 is fabricated by using the solar cell element 101 obtained as described above.

First, the wiring member 25 is prepared and arranged such that the plural solar cell elements 101 adjacent to each other are electrically connected through the wiring member 25. The wiring member 25 may be a member coated with a solder material or a member made of a metal foil, as described above.

When the wiring member 25 coated with the solder material is used, the wiring member 25 can be connected by a method using a soldering iron, hot air, a laser, a pulse heater or the like. With such a method, the wiring member 25 is soldered to the bus bar electrode 11, the fine wire electrode 13, the second output taking-out electrode 7*a*, and so on.

When the wiring member 25 is made of the metal foil, the wiring member 25 can be connected to the bus bar electrode 11, the fine wire electrode 13, the second output taking-out electrode 7*a*, and so on by using a cold setting conductive adhesive. A method using the conductive adhesive can be performed by applying the conductive adhesive between each of the bus bar electrode 11, the fine wire electrode 13, and the second output taking-out electrode 7*a* and the wiring member 25, and then heat-treating the conductive adhesive at about 150 to 250° C. The conductive adhesive may be, for example, a composition containing a binder made of epoxy resin, silicone resin, polyimide resin, polyurethane resin or the like, and a conductive filler made of silver, nickel carbon or the like.

Next, a module body is fabricated by successively stacking, on the light transmissive member 21, the front-side filling member 22, the plural solar cell elements 101 interconnected by the wiring member 25, the rear-side filling member 23, and the rear surface protective member 24. Finally, the module body is degassed, heated, and pressed inside a laminator into an integral unit, whereby the solar cell module 201 is fabricated.

Figure 5B:
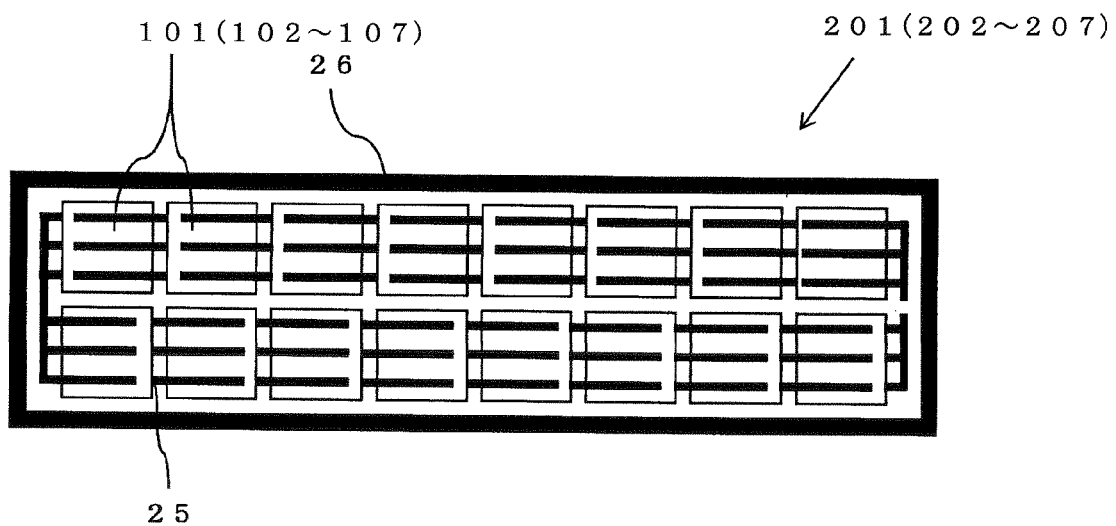

As illustrated in FIG. 5B, a frame 26 made of, e.g., aluminum may be fitted to an outer periphery of the solar cell module 201 when required. Furthermore, as illustrated in FIG. 5A, respective one end portions of electrodes of the first one and the last one of the plural solar cell elements 101, which are connected in series, are each connected via an output taking-out wire 28 to a terminal box 27 through which an output is taken out to the outside.

The solar cell module 201 according to this embodiment can be obtained through the procedures described above.

Second Embodiment

Other embodiments of the present invention will be described below. It is to be noted that, in the following, similar components to those in the first embodiment are denoted by the same reference signs, and description of those components is omitted.

Figure 6A:
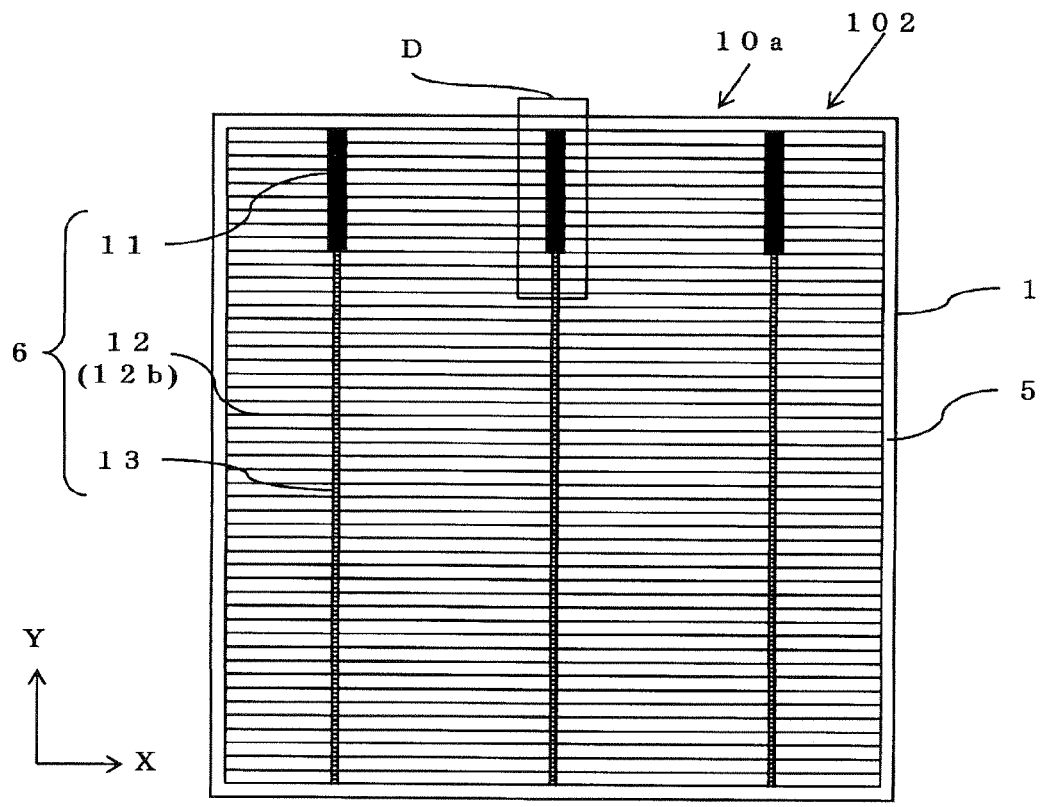
FIGS. 6A to 6C are schematic plan views of a solar cell element in a solar cell module according to a second embodiment of the present invention when looking from the side facing a first surface of the solar cell element; specifically.
Figure 6B:
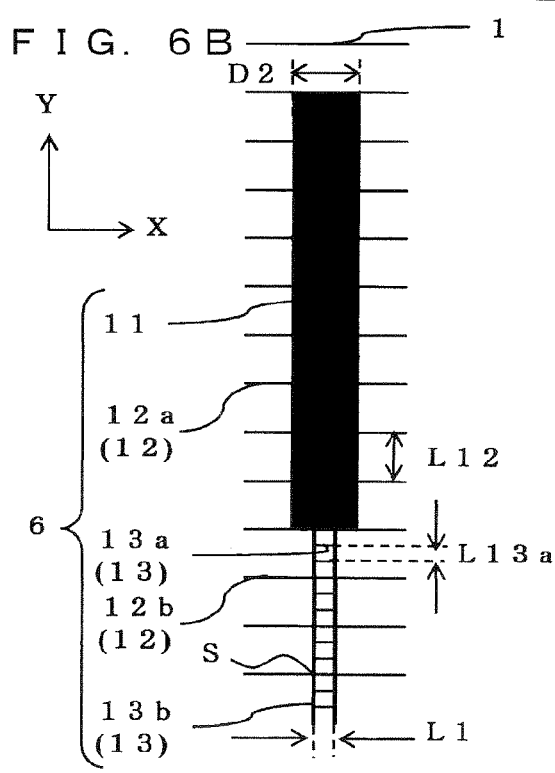
Figure 6C:
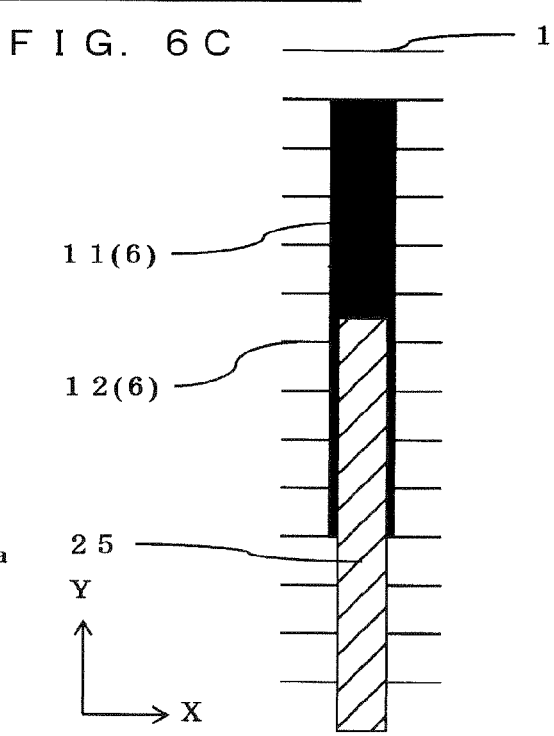

A solar cell element 102 in a solar cell module 202 according to a second embodiment of the present invention is different from the solar cell element 101 in the configuration of the first electrode 6 of the solar cell element, as illustrated in FIGS. 6A to 6C.

In FIGS. 6A to 6C, a first fine wire electrode 13*a* of a solar cell element 102 is further formed between the adjacent second finger electrodes 12*b*. The first fine wire electrode 13*a* is electrically connected to the second fine wire electrode 13*b*. Thus, the number of intersections S between the first fine wire electrodes 13*a* and the second fine wire electrodes 13*b* can be increased, and stress possibly generated in the first fine wire electrode 13*a* can be further mitigated. Moreover, in this embodiment, the distance between the adjacent first fine wire electrodes 13*a* is shortened. As a result, the power loss is further reduced.

Although the first fine wire electrode 13*a* may be disposed in any desired number between the second finger electrodes 12*b*, it is sufficient that one or two first fine wire electrodes 13*a* are disposed between the second finger electrodes 12*b*. In this embodiment, a distance L13*a* between the first fine wire electrodes 13*a* is about ¼ to ½ of a distance L12 between the adjacent second finger electrodes 12*b*. Such a condition increases the effect of cutting the amount of electrode material used and reducing the power loss.

Third Embodiment

Figure 7A:
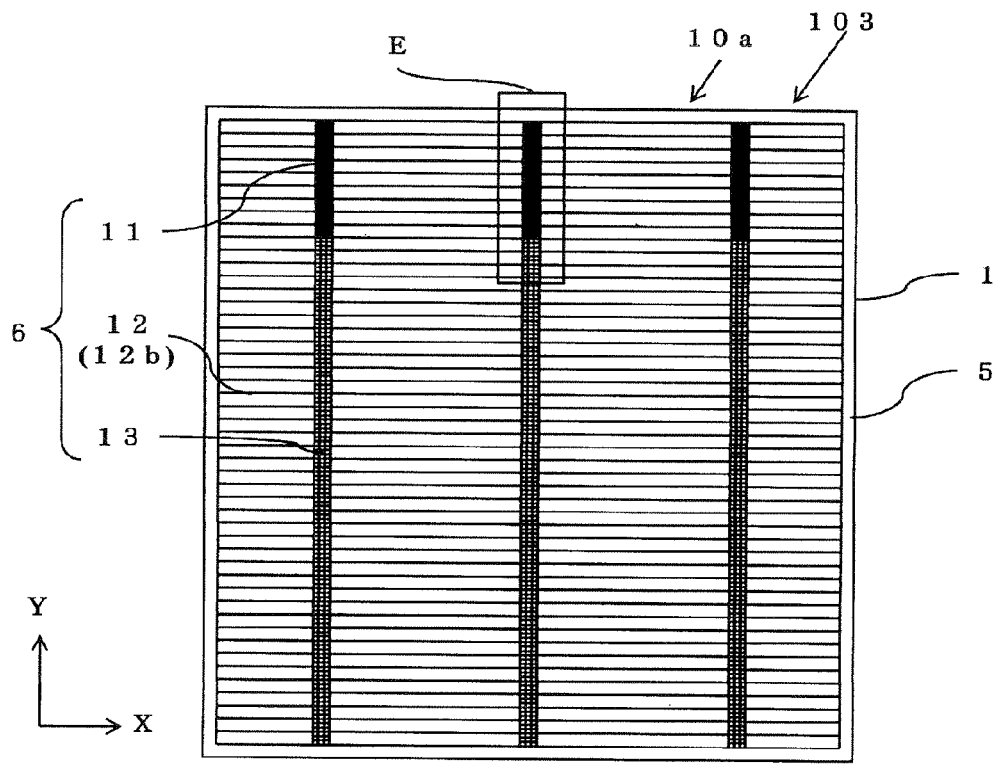
FIGS. 7A to 7C are schematic plan views of a solar cell element in a solar cell module according to a third embodiment of the present invention when looking from the side facing a first surface of the solar cell element; specifically.
Figure 7B:
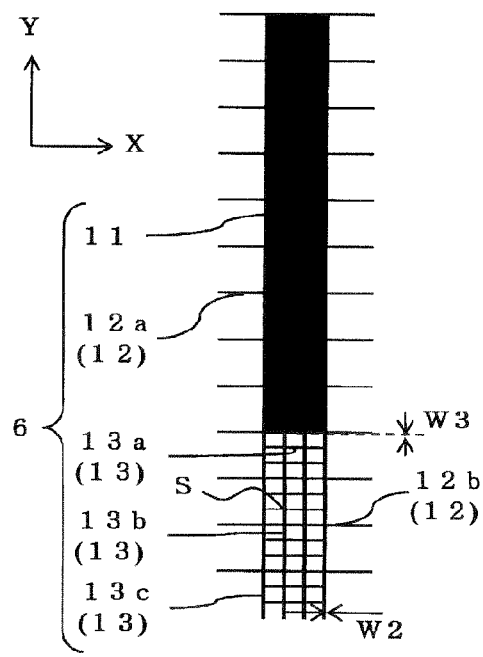
Figure 7C:
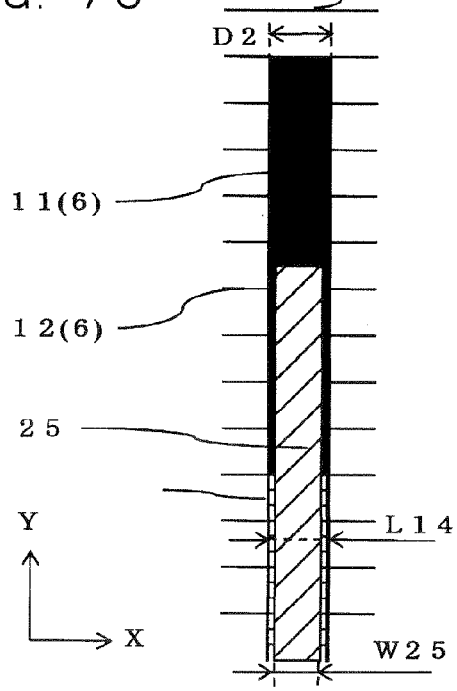

A solar cell element 103 in a solar cell module 203 according to a third embodiment of the present invention is different from the solar cell element 101 in the configuration of the first electrode 6 of the solar cell element, as illustrated in FIGS. 7A to 7C.

In FIGS. 7A to 7C, a fine wire electrode 13 of a solar cell element 103 further includes, as illustrated in FIGS. 7A to 7C, third fine wire electrodes 13*c* each of which connects the adjacent second finger electrodes 12*b* to each other and which are connected to a pair of lateral portions of the bus bar electrode 11 extending in the first direction (Y-direction), when looking from the side facing the first surface 10*a*. In that arrangement, the third fine wire electrodes 13*c* extend in the Y-direction. In this embodiment, the third fine wire electrodes 13*c* are disposed separately from the wiring member 25 in the vicinity of the wiring member 25 on both sides thereof. Accordingly, even when the wiring member 25 is disconnected from a part of the first fine wire electrodes 13*a* by the action of excessive stress or the like, the collected electric power can be supplied to the first fine wire electrode 13*a*, which is adjacent to the disconnected first fine wire electrode 13*a*, through the third fine wire electrodes 13*c*. As a result, the power loss can be reduced. When the third fine wire electrodes 13*c* are not connected to the wiring member 25, the third fine wire electrodes 13*c* are less susceptible to the action of stress caused by the temperature cycle of the wiring member 25 and are harder to break. While, in this embodiment, the third fine wire electrodes 13*c* are formed in a state extending from the pair of lateral portions of the bus bar electrode 11, respectively, the arrangement of the third fine wire electrodes 13*c* is not limited to such an example. As another example, one third fine wire electrode 13*c* may be formed in continuity with at least one of the lateral portions of the wiring member 25. Even such a modified configuration can also reduce the power loss.

In addition, a width W2 of the third fine wire electrode 13*c* in the short direction thereof (i.e., in the X-direction in FIG. 7B) may be greater than the width W3 of the finger electrode 12 in the short direction thereof (i.e., in the Y-direction in FIG. 7B). That setting can contribute to further reducing the power loss. The width W2 of the third fine wire electrode 13*c* in the short direction thereof is set to be, for example, about 1.5 to 3 times greater than the width W3 of the finger electrode 12 in the short direction thereof. The width W2 of the third fine wire electrode 13*c* in the short direction thereof is about 75 to 600 μm.

As illustrated in FIG. 7C, when the third fine wire electrodes 13c are disposed in pair in the vicinity of both ends of the wiring member 25, a distance L14 between the third fine wire electrodes 13c may be set greater than a width W25 of the wiring member 25 in the short direction thereof (i.e., in the X-direction in FIG. 7C). While, in this embodiment, the third fine wire electrodes 13c are formed in continuity with the lateral portions of the bus bar electrode 11, the arrangement of the third fine wire electrodes 13c is not limited to such an example. The power loss is reduced by forming the third fine wire electrodes 13c on condition that a relation of the distance L14>the width W25 is satisfied.

Fourth Embodiment

Figure 8:
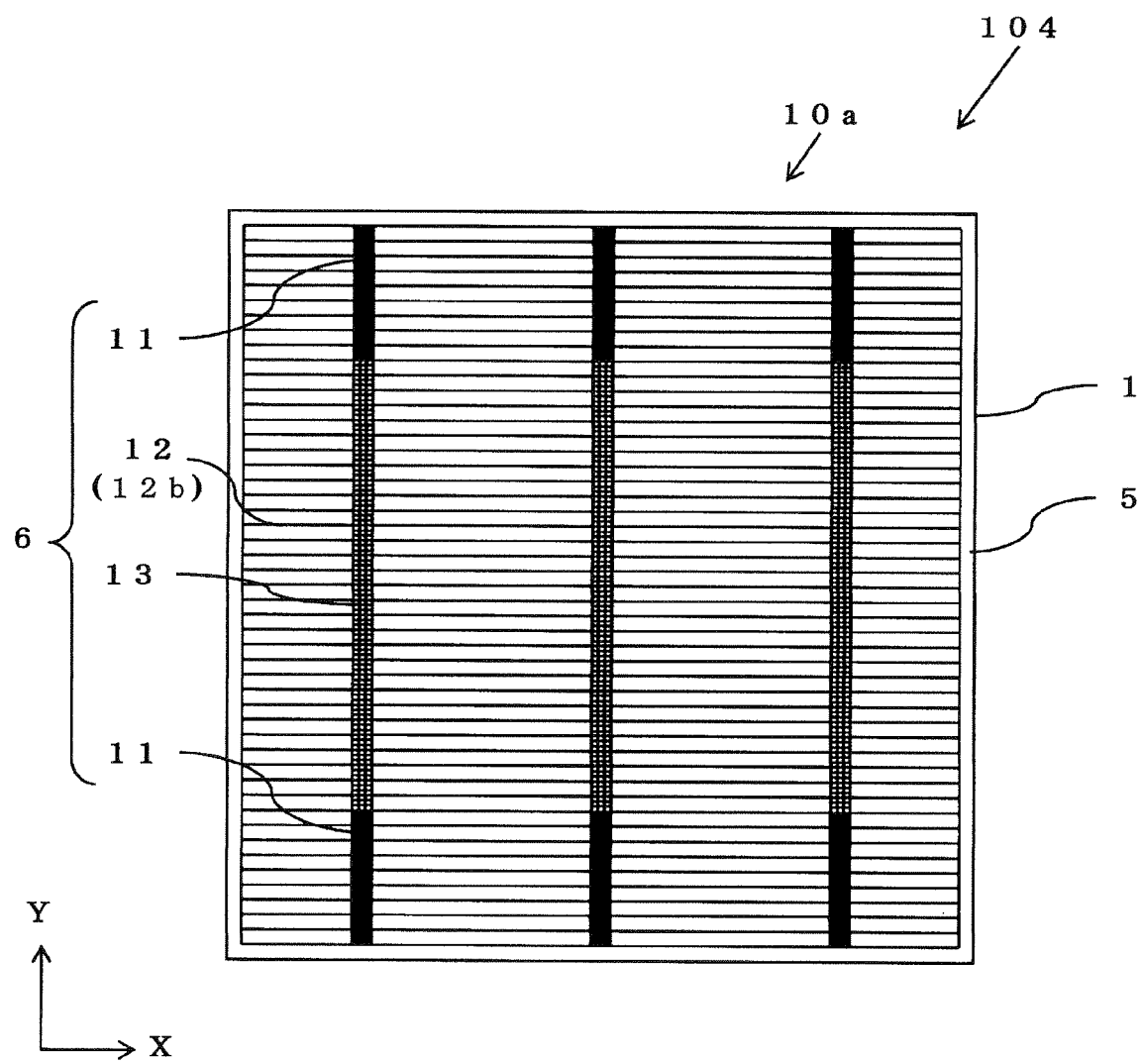
FIG. 8 is a schematic plan view of a solar cell element in a solar cell module according to a fourth embodiment of the present invention when looking from the side facing a first surface of the solar cell element.

A solar cell element 104 in a solar cell module 204 according to a fourth embodiment of the present invention is different from the solar cell element 103 in the shape of the first electrode 6 of the solar cell element, as illustrated in FIG. 8.

In FIG. 8, a plurality of the bus bar electrode 11 of the solar cell element 104 are arranged in the wiring direction (i.e., in the Y-direction in FIG. 8) that corresponds to the first direction. Such an arrangement can increase an area where the solar cell element 104 is connected to the wiring member 25 in comparison with that in the solar cell element 103. On that occasion, the connection area between the bus bar electrodes 11 and the wiring member 25 may be not less than 2% and less than 50% of a total surface area of the wiring member 25, which faces the solar cell element 104. As a result, in this embodiment, the amount of electrode material used is reduced while high reliability in connection is maintained.

The first electrode 6 in the solar cell element 104 includes the bus bar electrodes 11 at both ends in the wiring direction (Y-direction). Accordingly, even when the solar cell element 104 is connected upside down in operation of connecting the wiring member 25 to the first electrode 6 of the solar cell element 104, a connection failure and the like is less likely to occur. As a result, working efficiency in manufacturing of the solar cell module can be increased.

Fifth Embodiment

Figure 9:
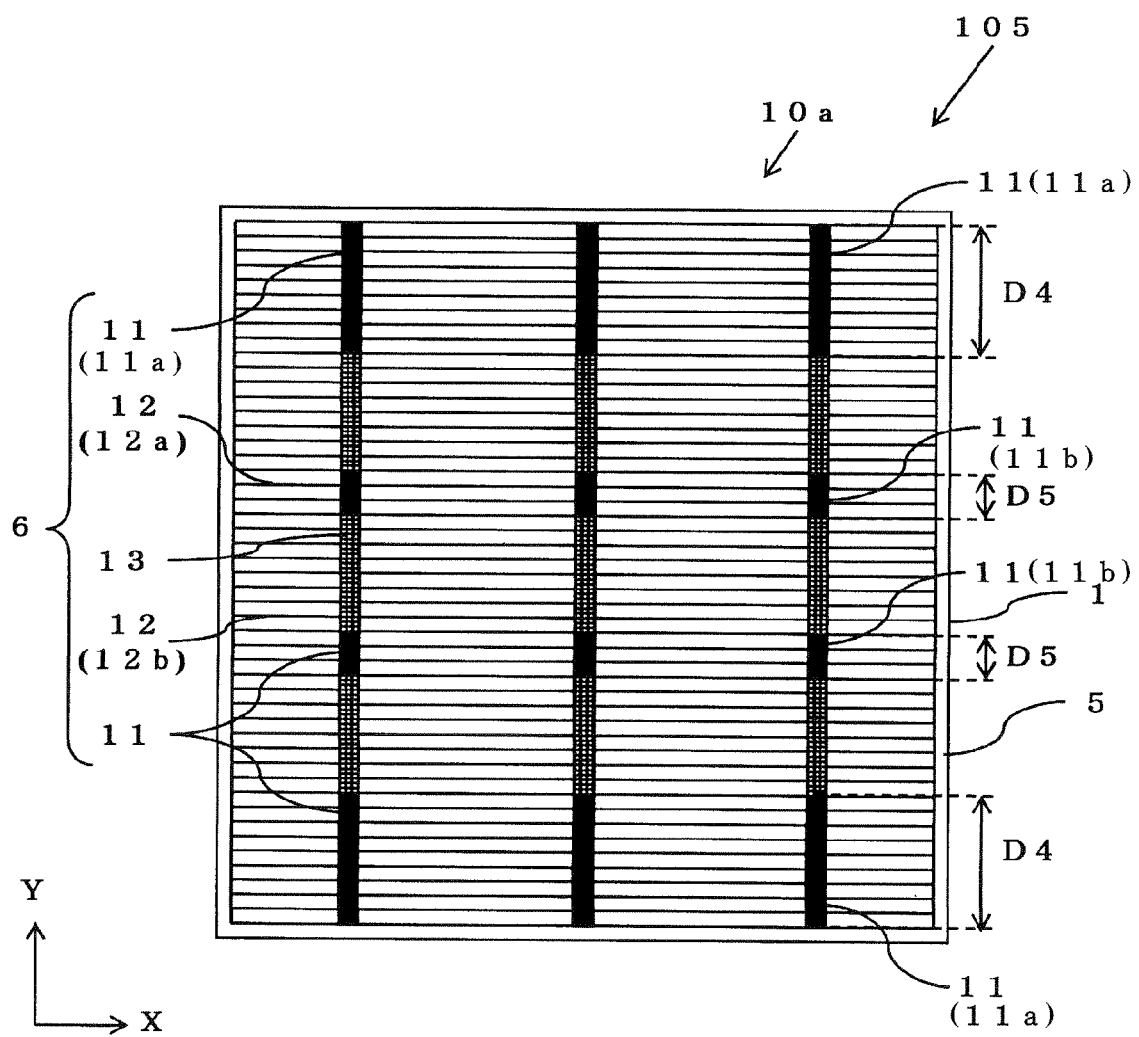
FIG. 9 is a schematic plan view of a solar cell element in a solar cell module according to a fifth embodiment of the present invention when looking from the side facing a first surface of the solar cell element.

A solar cell element 105 in a solar cell module 205 according to a fifth embodiment of the present invention is different from the solar cell element 104 in the shape of the first electrode 6 of the solar cell element, as illustrated in FIG. 9.

In FIG. 9, a solar cell element 105 includes bus bar electrodes 11 at not only both end portions of the solar cell element 105 in the wiring direction (Y-direction), but also at other positions. More specifically, in the solar cell element 105, four bus bar electrodes 11 are disposed at intervals in the wiring direction. With such an arrangement, one solar cell element 105 can be easily divided into a plurality of smaller solar cell elements. In that case, the solar cell element 105 is divided such that, in each of the smaller solar cell elements after the division, the bus bar electrode 11 is arranged at a position where the end portion of the wiring member 25 is located. Thus, similar advantageous effects to those described above can be obtained in the smaller solar cell elements after the division.

Furthermore, looking at the plural bus bar electrodes 11 in the solar cell element 105, a fourth dimension D4 of the bus bar electrode 11 (first bus bar electrode 11a) in the wiring direction (i.e., in the Y-direction in FIG. 9), which is connected to the end portion of the wiring member 25 in the smaller solar cell element after the division, is greater than a fifth dimension D5 of the other bus bar electrode 11 (second bus bar electrode 11b) in the wiring direction. With that setting, when the smaller solar cell elements after the division are electrically connected to each other through the wiring members 25, the connection between the end portions of the wiring members 25 is facilitated even if the positions of the wiring members 25 are relatively deviated. As a result, efficiency of the wiring operation and reliability in connection are increased.

Sixth Embodiment

Figure 10A:
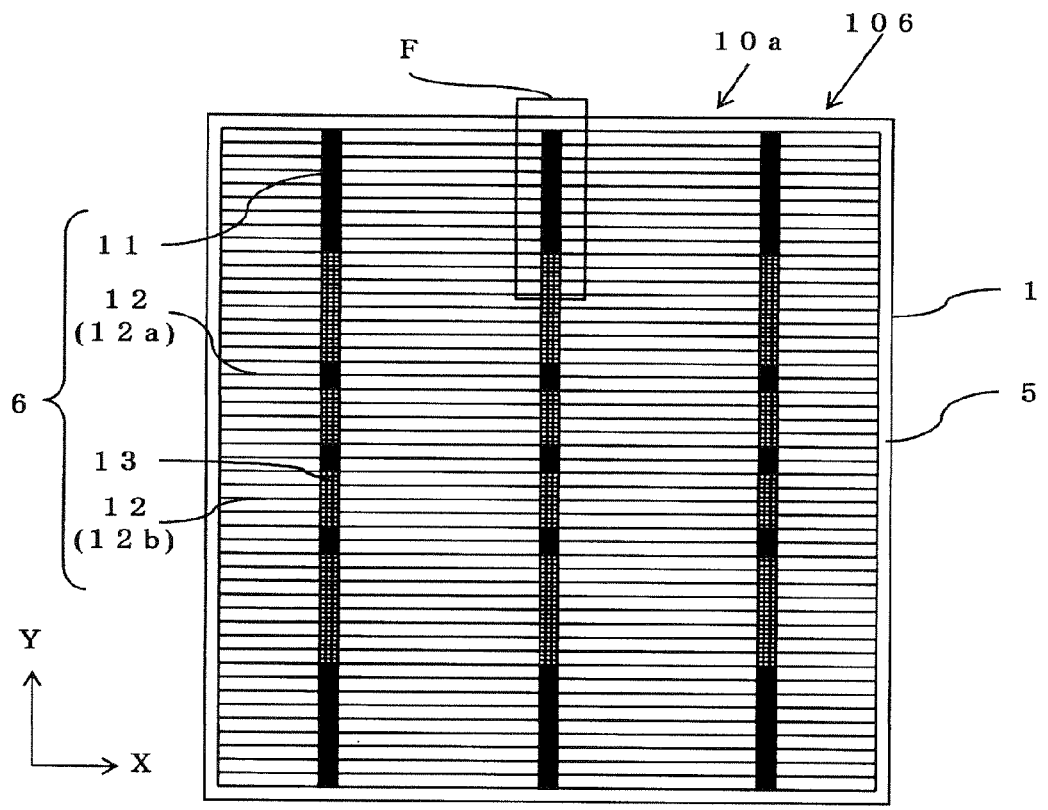
FIGS. 10A to 10C are schematic plan views of a solar cell element in a solar cell module according to a sixth embodiment of the present invention when looking from the side facing a first surface of the solar cell element; specifically.
Figures 10B, 10C:
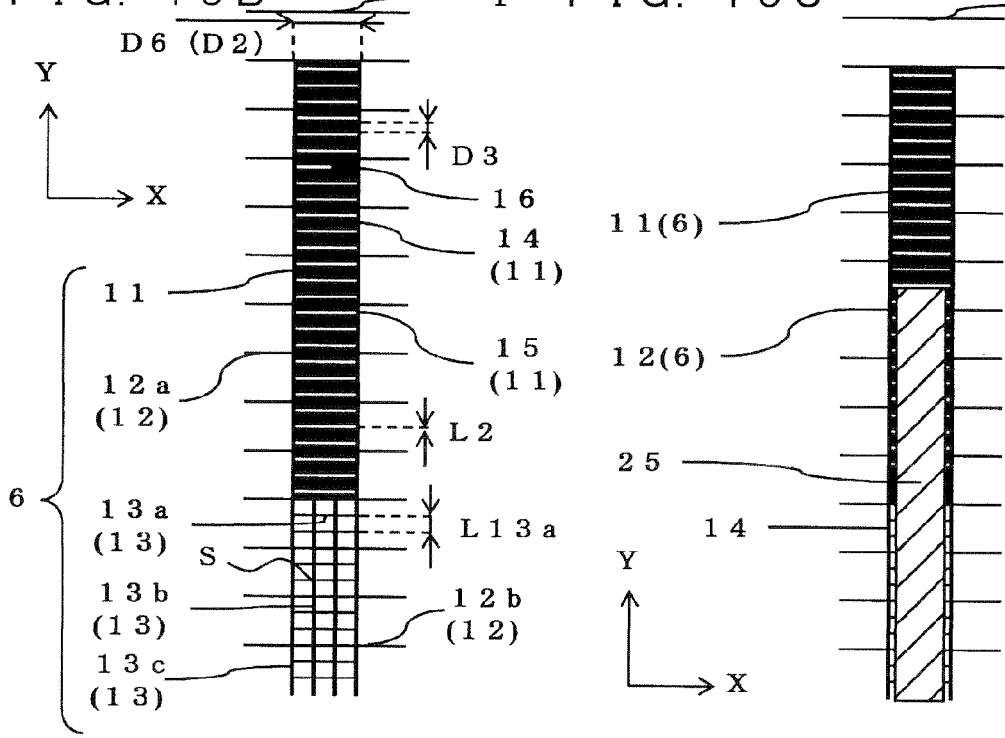

A solar cell element 106 in a solar cell module 206 according to a sixth embodiment of the present invention is different from the solar cell element 105 in the shape of a first electrode 6 of a solar cell element, as illustrated in FIGS. 10A to 10C.

In FIGS. 10A to 10C, each bus bar electrode 11 of the solar cell element 106 includes a plurality of island portions 14 that are arrayed at intervals in the wiring direction (i.e., in the Y-direction in FIGS. 10A to 10C), and connecting portions 15 that connect the plurality of island portions 14. Corresponding to such an arrangement, a plurality of gaps 16 arrayed at intervals in the first direction (Y-direction) and extending in the second direction (X-direction) are formed in the bus bar electrode 11 of the solar cell element 106. The end portion of the wiring member 25 is connected to the island portions 14. The connecting portions 15 are connected to ends of the island portions 14 in a direction (i.e., in the X-direction in FIGS. 10A to 10C) perpendicular to the wiring direction. Furthermore, as illustrated in FIG. 10B, the island portions 14 are each formed such that a third dimension D3 of the island portion 14 in the wiring direction (i.e., in the Y-direction in FIG. 10B) is smaller than a sixth dimension D6 thereof in the direction (i.e., in the X-direction in FIG. 10B) perpendicular to the wiring direction. In other words, the short direction of the island portion 14 is the same as the wiring direction. The third dimension D3 corresponds to the distance between the adjacent gaps 16.

By forming the island portions 14, which constitute the bus bar electrodes 11, in the above-described shape, even when the end portion of the wiring member 25 is disconnected by the action of stress from the island portion 14 to which the wiring member 25 has been connected, the connection of the wiring member 25 to the other island portions 14 can be maintained. Thus, the wiring member 25 is less apt to completely peel off from the bus bar electrodes 11, and partial connection between them is maintained.

In this embodiment, the third dimension D3 of the island portion 14 in the short direction thereof is greater than a width W11 of the first fine wire electrode 13a in the short direction thereof. Moreover, in this embodiment, a second distance L2 between the adjacent island portions 14 is smaller than the third dimension D3 of the island portion 14 in the short direction thereof. Accordingly, even when the solar cell module 206 is used for a comparatively long term, the wiring member 25 is less apt to disconnect from the first electrode 6. As a result, the connection region between the bus bar electrodes 11 and the wiring member 25 can be easily maintained. The second distance L2 corresponds to the width of the gap 16 in the Y-direction.

Herein, the third dimension D3 of the island portion 14 in the short direction thereof (i.e., in the Y-direction in FIGS. 10A to 10C) is about 300 to 1000 μm, for example. A sixth dimension D6 of the island portion 14 in the longitudinal direction thereof (i.e., in the X-direction in FIGS. 10A to 10C) is substantially the same as the second dimension D2 of the bus bar electrode 11 in the direction perpendicular to the wiring direction in the first embodiment, and it is about 1.3 to 2.5 mm, for example. The second distance L2 between the adjacent island portions 14 is about 50 to 250 μm, for example.

In addition, as illustrated in FIG. 10B, the distance L13a between the adjacent first fine wire electrodes 13a is greater than the second distance L2 between the adjacent island portions 14. As a result, even when the wiring member 25 is disconnected from a part of the first fine wire electrodes 13a, the power loss can be reduced while the amount of electrode material used is reduced.

Seventh Embodiment

Figure 11A:
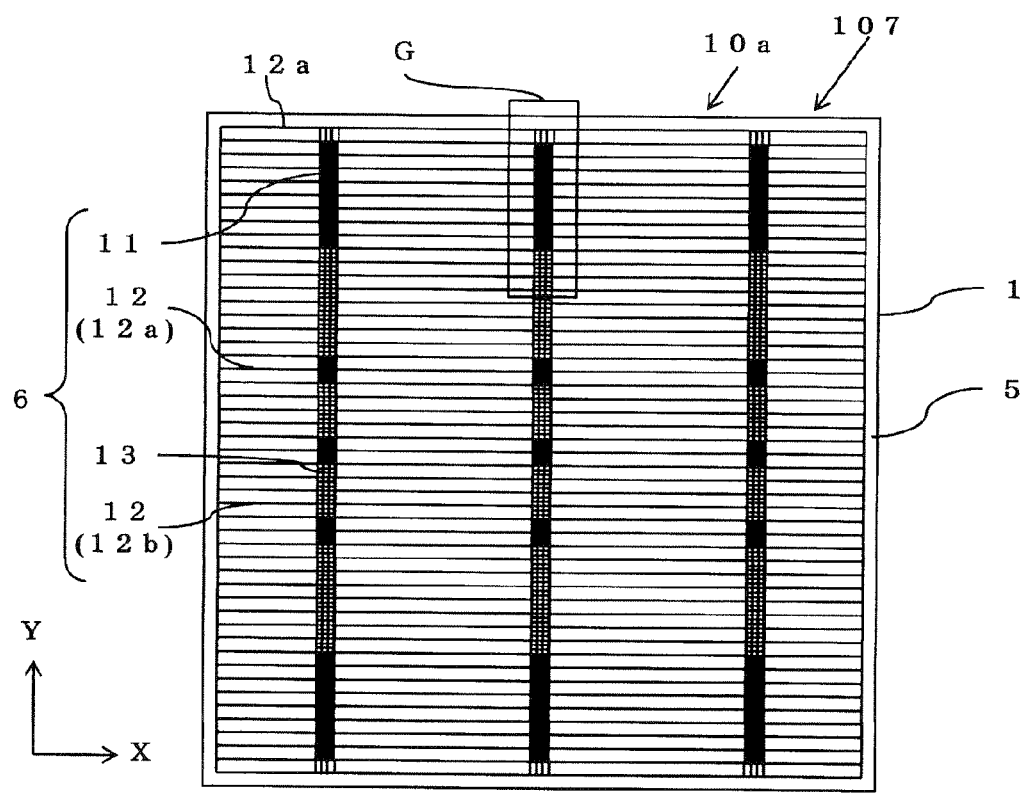
FIGS. 11A to 11C are schematic plan views of a solar cell element in a solar cell module according to a seventh embodiment of the present invention when looking from the side facing a first surface of the solar cell element; specifically.
Figure 11B:
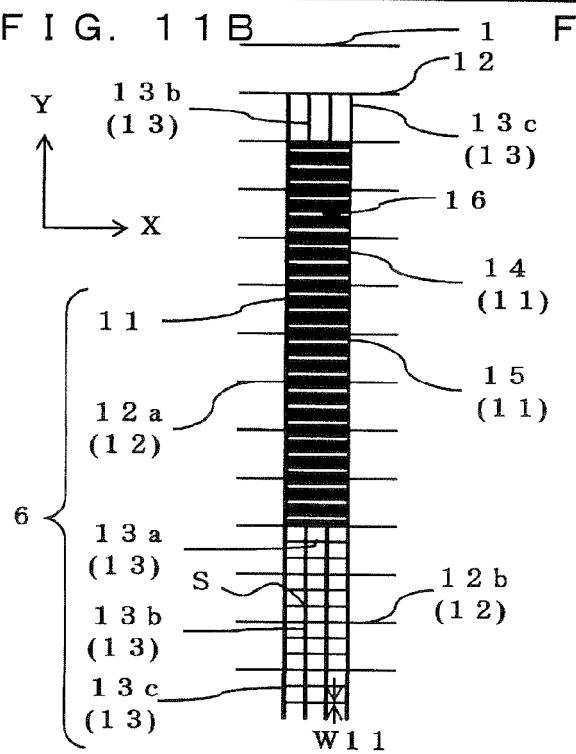
Figure 11C:
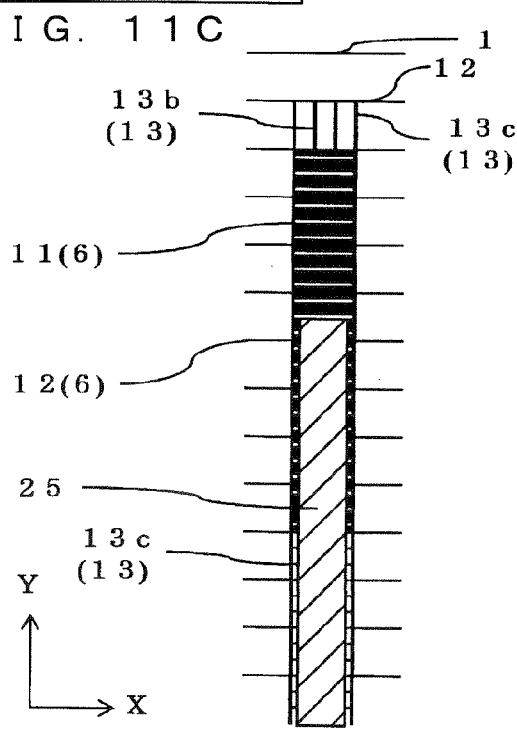

A solar cell element 107 in a solar cell module 207 according to a seventh embodiment of the present invention is different from the solar cell element 106 in the shape of the first electrode 6 of the solar cell element, as illustrated in FIGS. 11A to 11C.

In FIGS. 11A to 11C, the solar cell element 107 includes second fine wire electrodes 13b and third fine wire electrodes 13c extending outward to the periphery of the semiconductor substrate 1 from each of the bus bar electrodes 11, which are disposed at both ends of the first electrode 6. The second fine wire electrodes 13b and the third fine wire electrodes 13c are connected to the finger electrodes 12 that are positioned outside the bus bar electrodes 11. Accordingly, electric power can be further collected from the finger electrodes 12, which are positioned outside the bus bar electrodes 11, through the second fine wire electrodes 13b and the third fine wire electrodes 13c. While the second fine wire electrodes 13b and the third fine wire electrodes 13c are both disposed in this embodiment, at least one type of the second and third fine wire electrodes 13b and 13c may be disposed. In the case where only one type of the second and third fine wire electrodes 13b and 13c is disposed, the amount of electrode material used can be reduced. The number of the finger electrodes 12 positioned outside the bus bar electrode 11 may be set to five or less, for example. In this regard, when the number of the finger electrodes 12 is one, the resistance loss can be further reduced.

While several embodiments of the present invention have been described above, the present invention is not limited to the above-described embodiments. It is a matter of course that the present invention can be practiced in optional forms insofar as not departing from the gist of the invention.

For instance, a passivation film may be formed at the second surface 10b side of the semiconductor substrate 1. The passivation film acts to reduce recombination of carries at the second surface 10b that corresponds to the rear surface of the semiconductor substrate 1. The passivation film may be, for example, one of Si-based nitride films, such as a silicon nitride ($Si_3N_4$) film and a nitride film of amorphous Si (a-SiNx), or one of films of silicon oxide ($SiO_2$), aluminum oxide ($Al_2O_3$), and titanium oxide ($TiO_2$). A thickness of the passivation film may be about 100 to 2000 Å. The passivation film may be formed, for example, by the PECVD method, the vapor deposition method, the sputtering method or the like. Thus, the second surface 10b side of the semiconductor substrate 1 may be formed into a structure that is employed in the PERC (Passivated Emitter and Rear Cell) structure or the PERL (Passivated Emitter Rear Locally-diffused) structure. The second electrode 7 may be formed in a similar shape to that of the first electrode 6 described above.

REFERENCE SIGNS LIST

1: semiconductor substrate
2: first semiconductor layer
3: second semiconductor layer
4: third semiconductor layer
5: anti-reflection layer
6: first electrode (front surface electrode)
7: second electrode (rear surface electrode)
10a: first surface
10b: second surface
11: bus bar electrode (first output taking-out electrode)
12: finger electrode (first power collecting electrode)
13: fine wire electrode
14: island portion
15: connecting portion
16: gap
25: wiring member
101 to 107: solar cell element
201 to 207: solar cell module
S: intersection

The invention claimed is:

1. A solar cell module comprising a plurality of solar cell elements each including:
   a front surface and a front surface electrode on a side of the front surface; and
   a wiring member that electrically interconnects the solar cell elements and that extends in a first direction,
   wherein the front surface electrode includes
      a bus bar electrode extending in the first direction,
      finger electrodes arrayed at intervals in the first direction, the finger electrodes including a plurality of first finger electrodes having a linear shape and connected to the bus bar electrode, and a plurality of second finger electrodes not connected to the bus bar electrode, and
      a fine wire electrode that is disposed in a region extending from the bus bar electrode in a longitudinal direction of the bus bar electrode and that is electrically connected to the second finger electrode, the fine wire electrode including a first fine wire electrode and a second fine wire electrode intersecting the first fine wire electrode,
   wherein the fine wire electrode has a width W1 smaller than both a first dimension D1 of the bus bar electrode in the first direction and a second dimension D2 of the bus bar electrode in a second direction perpendicular to the first direction, and
   the wiring member is connected to an intersection of the first fine wire electrode and the second fine wire electrode and to the bus bar electrode.

2. The solar cell module according to claim 1, wherein an end portion of the wiring member in the first direction is connected to the bus bar electrode.

3. The solar cell module according to claim 1, wherein the first fine wire electrode extends in the second direction, and the second fine wire electrode extends in the first direction.

4. The solar cell module according to claim 3, wherein the first fine wire electrode is a portion of the second finger electrode.

5. The solar cell module according to claim 3, wherein the first fine wire electrode is disposed between the adjacent second finger electrodes.

6. The solar cell module according to claim 1, wherein a width W12 of the second fine wire electrode is greater than a width W11 of the first fine wire electrode.

7. The solar cell module according to claim 1, wherein the second fine wire electrode is a pair of electrodes connected to the bus bar electrode and arrayed side by side at spacing of a first distance L1 that is smaller than the second dimension D2 of the bus bar electrode.

8. The solar cell module according to claim 1, wherein the fine wire electrode further includes a third fine wire electrode, which connects the adjacent second finger electrodes to each other, which is connected to at least one of a pair of lateral portions of the bus bar electrode, and which extends in the first direction.

9. The solar cell module according to claim 8, wherein the third fine wire electrode is arranged such that the third fine wire electrode is connected to each of the pair of lateral portions of the bus bar electrode and extends in the first direction.

10. The solar cell module according to claim 8, wherein a width W2 of the third fine wire electrode is greater than a width W3 of the second finger electrode.

11. The solar cell module according to claim 1, wherein the bus bar electrode includes a plurality of gaps, which are arrayed at intervals in the first direction and which extend in the second direction, a third dimension D3 between the adjacent gaps in the first direction is greater than the width W11 of the first fine wire electrode, and a second distance L2 across the gap in the first direction is smaller than the third dimension D3.

12. The solar cell module according to claim 1, wherein a plurality of the bus bar electrodes are arrayed along the first direction.

13. The solar cell module according to claim 2, wherein a plurality of the bus bar electrodes are arranged along the first direction and, of the arrayed bus bar electrodes, a fourth dimension D4 of the bus bar electrode in the first direction, to which the end portion of the wiring member is connected, is greater than a fifth dimension D5 of the other bus bar electrode in the first direction.

* * * * *